United States Patent
Richards et al.

(10) Patent No.: US 6,856,447 B2
(45) Date of Patent: Feb. 15, 2005

(54) METHODS AND APPARATUS FOR SELECTIVELY UPDATING MEMORY CELL ARRAYS

(75) Inventors: Peter Richards, San Francisco, CA (US); Andrew G. Huibers, Palo Alto, CA (US)

(73) Assignee: Reflectivity, Inc., Sunnyvale, CA (US)

(*) Notice: Subject to any disclaimer, the term of this patent is extended or adjusted under 35 U.S.C. 154(b) by 0 days.

(21) Appl. No.: 10/407,061

(22) Filed: Apr. 2, 2003

(65) Prior Publication Data

US 2004/0196722 A1 Oct. 7, 2004

Related U.S. Application Data

(63) Continuation-in-part of application No. 10/343,307, filed as application No. PCT/US01/24332 on Aug. 3, 2001.
(60) Provisional application No. 60/229,246, filed on Aug. 30, 2000.

(51) Int. Cl.[7] .................................... G02B 26/00
(52) U.S. Cl. ............... 359/291; 359/290; 359/292; 359/295
(58) Field of Search ..................... 359/291, 290, 359/292, 295, 297, 238, 242, 204, 92, 690; 345/204, 92, 690

(56) References Cited

U.S. PATENT DOCUMENTS 5,132,928 A    7/1992  Hayashikoshi et al.  365/185.13
6,760,168 B2 * 7/2004  Lee ........................... 359/834
2002/0138688 A1  9/2002  Hsu et al. .................. 711/105
2002/0154084 A1 * 10/2002  Tanaka et al. ............... 345/92

OTHER PUBLICATIONS

Kompenhouwer, et al, Optimally Reducing Motion Artifacts in Plasma Displays, Phillips Research Laboratories, SID 00 Digest, pp. 388–391.

Baker, et al, CMOS Circuit Design, Layout and Simulation, IEEE Press Series on Microelectronic Systems, IEEE Press, New York, pp. 345–349.

* cited by examiner

Primary Examiner—Timothy Thompson
(74) Attorney, Agent, or Firm—Gregory R. Muir

(57) ABSTRACT

Methods and apparatus for selectively updating memory cells of a memory cell array are provided. The memory cells of each row of the memory cell array are provided with a plurality of wordlines. Memory cells of the row are activated and updated by separated wordlines. In an application of display systems using memory cell arrays for controlling the pixels of the display system and pulse-width-modulation (PWM) technique for displaying grayscales, the pixels can be modulated by different PWM waveforms. The perceived dynamic-false-contouring artifacts are reduced thereby. In another application, the provision of multiple wordlines enables precise measurements of voltages maintained by memory cells of the memory cell array.

13 Claims, 15 Drawing Sheets

METHODS AND APPARATUS FOR SELECTIVELY UPDATING MEMORY CELL ARRAYS

CROSS-REFERENCE TO RELATED APPLICATIONS

This is a continuation-in-part of Ser. No. 10/343,307 filed Jan. 29, 2003, which is U.S. National Phase of PCT/US01/24332 filed Aug. 3, 2001, which claims priority from Ser. No. 09/631,536 filed Aug. 3, 2000 (now U.S. Pat. No. 6,529,310) and Ser. No. 60/229,246 filed Aug. 30, 2000, and Ser. No. 09/732,445 filed Dec. 07, 2000 (now U.S. Pat. No. 6,523,961).

TECHNICAL FIELD OF THE INVENTION

The present invention is related generally to memory cells, and, more particularly, to memory cell arrays used in spatial light modulators.

BACKGROUND OF THE INVENTION

In current memory cell arrays, memory cells in a row of the array are connected to a single wordline for activating the memory cells. For example, in a typical Dynamic Random Access memory (DRAM) cell array as illustrated in FIG. 1, DRAM cells of row 131 are connected to and activated by wordline 170. A critical constraint on this type of design is that, regardless of the user's intention, the wordline activates all memory cells of the row simultaneously for writing the intended memory cells during a writing cycle. Consequently, the timing of write events is highly correlated. This time-correlation may cause artifacts, such as dynamic-false-contouring (DFC) in display systems that employ memory cell arrays for controlling the pixels of the display systems and pulse-width-modulation (PWM) technique for displaying gray-scales of images.

As a way of example, FIGS. 2a to 2d illustrate the formation of DFC artifacts in the boundary of two neighboring pixels that are controlled by two neighboring memory cells sharing one wordline. Referring to FIG. 2a, pixels 351 and 353 are two neighboring pixels of the display system and are controlled by two neighboring memory cell, such as memory cells 191 and 193 in FIG. 1. Assuming that gray-scaled images of an object traversing from left to right are to be displayed by the two pixels, illumination intensities of the two pixels are modulated using PWM waveforms such that, in the screen (pixel) coordinate, the averaged illumination intensity over a frame duration T of each pixel corresponds to the desired grayscale of the image. As viewed by stationary human eyes, the difference of the averaged illumination intensity at the boundary of the two pixels is perceived as the contour of the object, as shown in FIG. 2b.

However, the contour of the object will be distorted in the retina coordinate in viewer's eye when the eyes move with the object. FIG. 2c presents the two pixels in the retina coordinate that moves with the eyes and the object. As can be seen, the pixels are distorted. The boundary of the two pixels is extended into a region, in which the averaged illumination intensity varies with position, as shown in FIG. 2d. This variation of the averaged illumination intensity will be perceived and recognized by the eyes as "real" contour of the object. This phenomenon is generally referred to as DFC artifact.

Therefore, methods and apparatus are desired for decorrelating the memory cells and associated pixels of a spatial light modulator such that the DFC like artifacts can be effectively reduced, if not removable.

SUMMARY OF THE INVENTION

In view of the forgoing, the present invention provides a method and an apparatus for selectively updating memory cells in each row of the memory cell arrays such that the update events of neighboring memory cells are decorrelated in time. As a result, the pixels corresponding to the memory cells are also time-decorrelated.

In an embodiment of the invention, a method is disclosed herein. The method comprises: providing a memory-cell array comprising a plurality of memory cells; and activating the memory cells of a row of the array using a plurality of separate word lines of the row such that at least two memory cells of the row are activated by separate word lines.

In another embodiment of the invention, a method for displaying a gray-scale image is disclosed herein. The method comprises: providing a spatial light modulator comprising an array of pixel elements; defining at least a first and a second waveform format based on a pulse-width-modulation technique; defining at least a first set of waveforms according to the first waveform format and the gray scale of the image; defining at least a second set of waveforms according to at least the second waveform format; updating the pixels of a row of the array in accordance with a plurality of waveforms that are selected from the first and second sets of waveforms such that at least a first pixel of the row is written in accordance with at least a first waveform selected from the first set of waveforms, and at least a second pixel other than the first pixel of the row is written in accordance with at least a second waveform selected from the second set of waveforms.

In yet another embodiment of the invention, a system is provided herein. The system comprises: a memory-cell array comprising a plurality of memory cells; and a plurality of word-lines coupled to the memory cells of a row of the memory-cell array for selectively activating the memory cells such that at least two memory cells of the row are coupled to separate word-lines of the plurality of word-lines.

In a further embodiment of the invention, a display system for displaying a gray-scale image on a target is proved herein. The display system comprises: a light source; a spatial light modulator that employs a pulse-width-modulation technique for displaying the image by reflecting a beam of incident light from the light source and selectively directing the reflected light to the target, the spatial light modulator further comprising: a plurality of micromirrors for selectively reflecting the beam of incident light onto the target; a memory-cell array having a plurality of memory cells for storing a set of information for controlling the deflections of the micromirrors; and a plurality of word lines coupled with the memory cells of a row of the memory-cell array for activating the memory cells for updating the stored information such that at least two different memory cells of the row can be actuated by separate word lines of the plurality of word lines.

In still a further embodiment of the invention, a method for displaying a gray-scale image on a target is disclosed herein. The method comprises: defining a set of separate waveforms in accordance with at least a gray-scale information of the image and based on a pulse-width-modulation technique; directing an incident light onto a micromirror array that has a plurality of deflectable reflective micromirrors; and selectively reflecting, by the micromirror array, the incident light onto the target according to the set of separate waveforms such that at least two different micromirrors of a row of the array reflect the incident light according to at least two separate waveforms.

In yet another embodiment of the invention, a method for displaying an image is disclosed herein. The method comprises: providing a spatial light modulator having rows and columns of pixels in an array; addressing pixels within a row of the array by providing a brightness level to each pixel in the row, the brightness level being achieved by activating each pixel with a series of bits of varying different lengths, wherein the combination of "on" bits during a frame corresponds to a brightness level for each pixel; and wherein the order of the series of bits for each pixel in a row is not the same or the weightings of the series of bits are different.

In still yet another embodiment of the invention, a method for displaying an image is disclosed herein. The method comprises: providing a spatial light modulator having rows and columns of pixels in an array; addressing pixels within a row of the array by providing a brightness level to each pixel in the row, the brightness level being achieved by activating each pixel with a series of bits of different lengths, wherein a plurality of pixels in the row have the same brightness level but a different combination of "on" and "off" bits during a frame.

In yet another embodiment of the invention, a spatial light modulator is provided herein. The spatial light modulator comprises: a plurality of rows and columns of pixels in an array; a bit line for each column; and a plurality of word lines for a row of the plurality of rows.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 2a through 2d illustrate a perceived dynamic-false-contouring artifact at the boundary of two neighboring memory cells; wherein FIG. 2a presents the two neighboring cells showing grayscales of a moving object in the screen coordinate; wherein FIG. 2b the shows perceived illumination intensity by the eyes of the shown grayscales of FIG. 2a in the screen coordinate; wherein FIG. 2c presents the two neighboring cells showing grayscales in the retina coordinate that moves with the moving object; and wherein FIG. 2d presents the perceived illumination intensity of the shown grayscales of FIG. 2c in the retina coordinate;

FIG. 4b illustrates a sub-array of the memory cell array of FIG. 4a;

FIG. 6b and FIG. 6c illustrate two exemplary binary-weighted pulse-width-modulation waveforms generated according to the waveform format in FIG. 6a;

FIG. 10a illustrates a row of pixels viewed by viewer eyes, the pixels showing a gray-scaled image of a moving object according to an embodiment if the invention, and the viewer eyes following the motion of the moving object FIG. 10b demonstrate the perceived illumination intensity of the pixels in FIG. 10a;

DETAILED DESCRIPTION OF THE INVENTION

Figure 1:
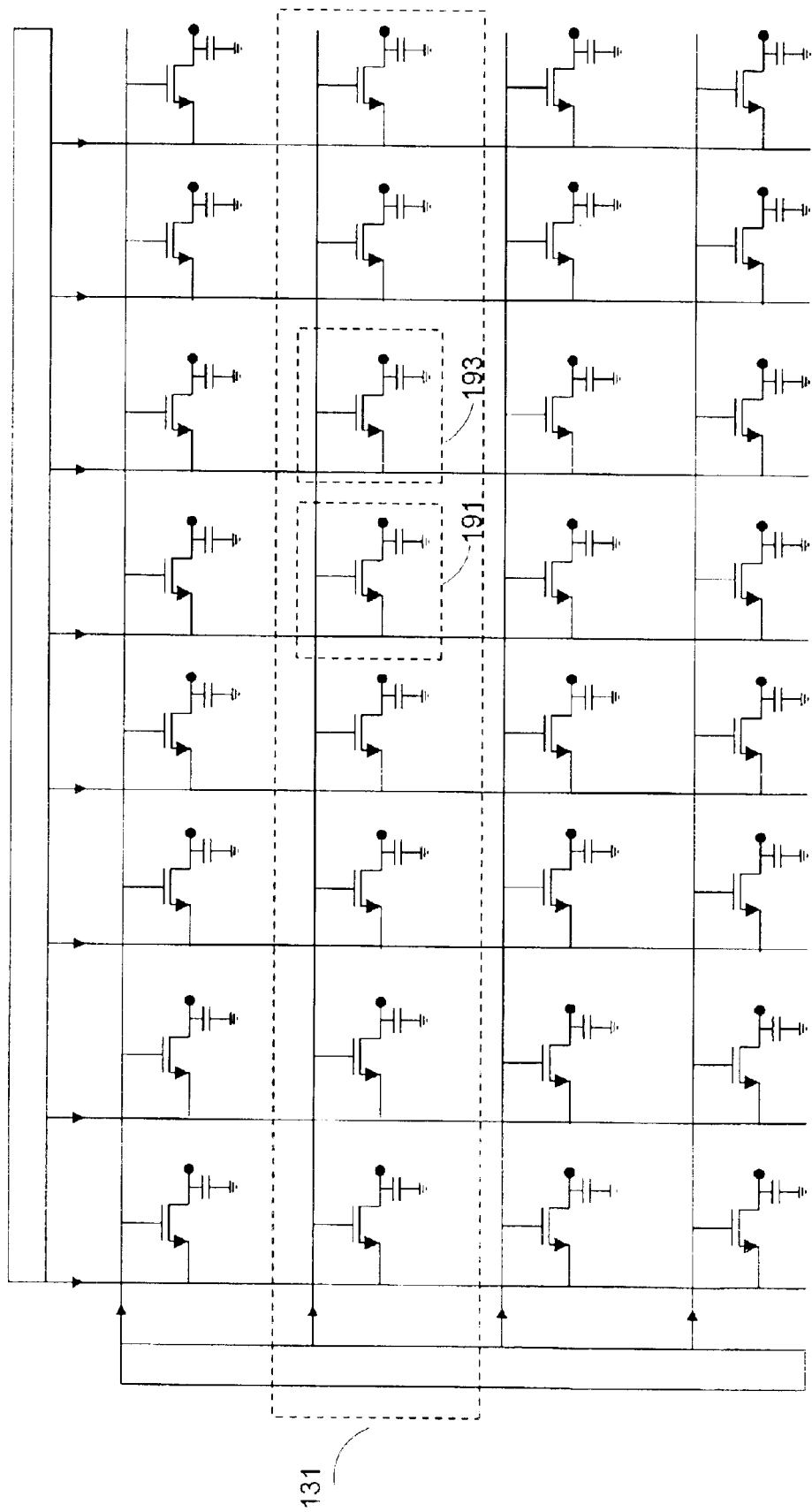
FIG. 1 presents a typical memory-cell array in prior art.
Figure 2A:
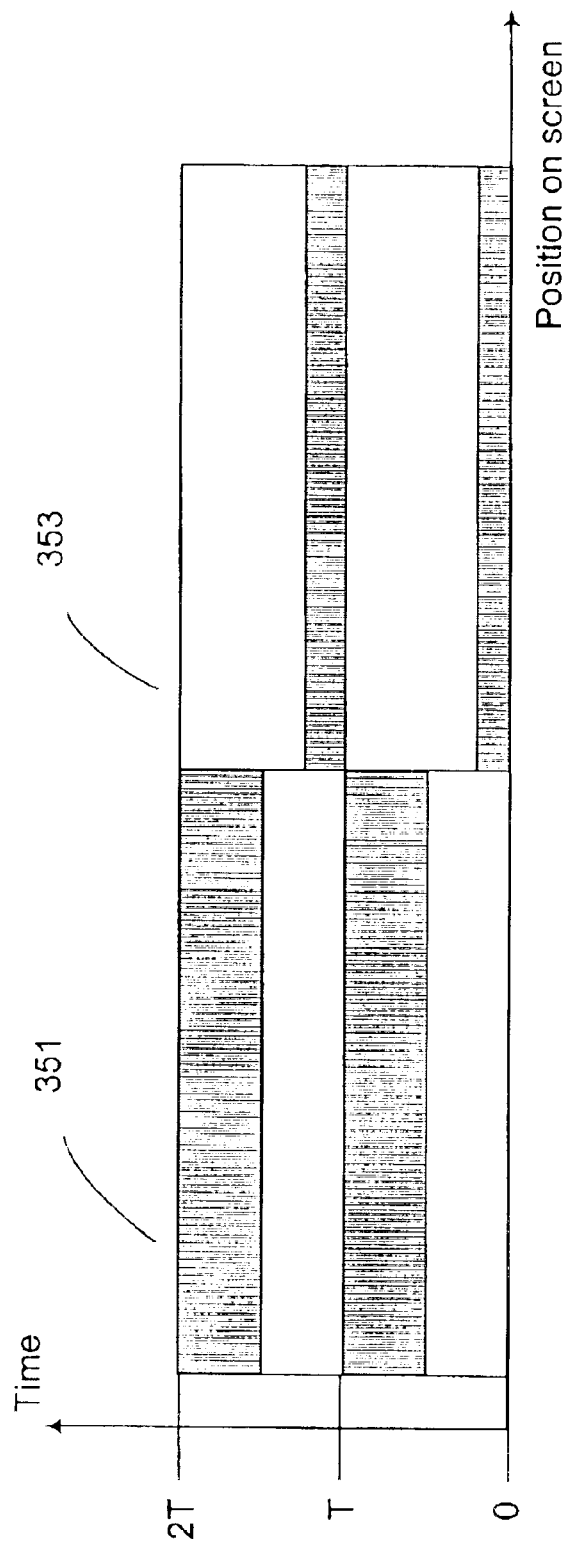
Figure 2B:
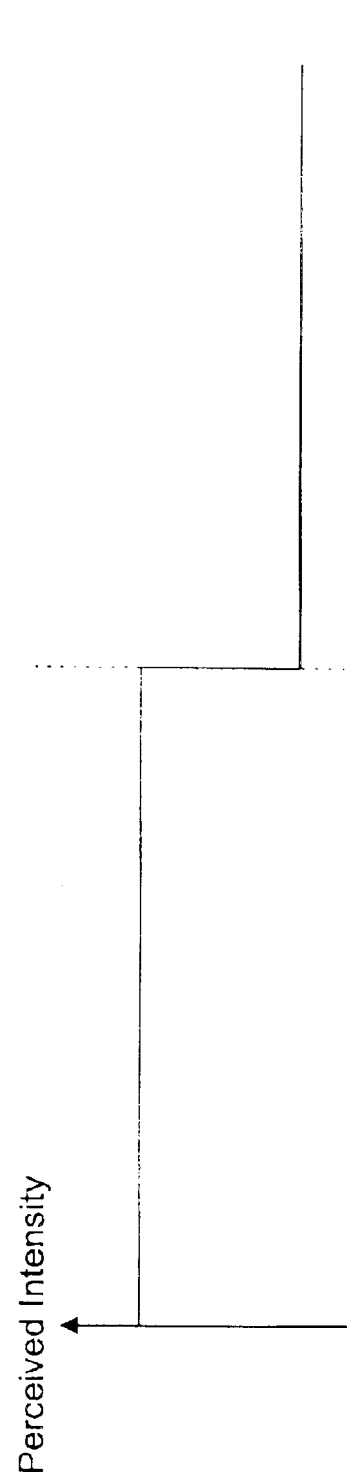
Figure 2C:
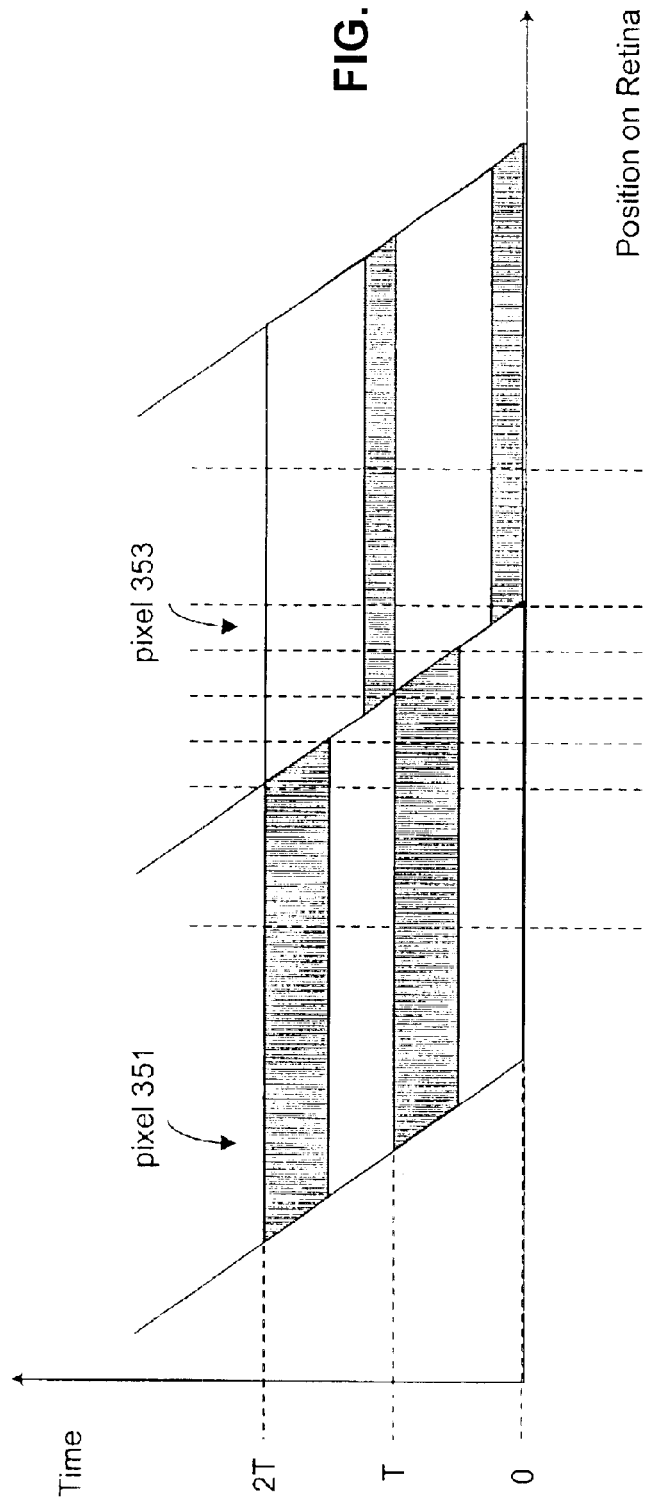
Figure 2D:
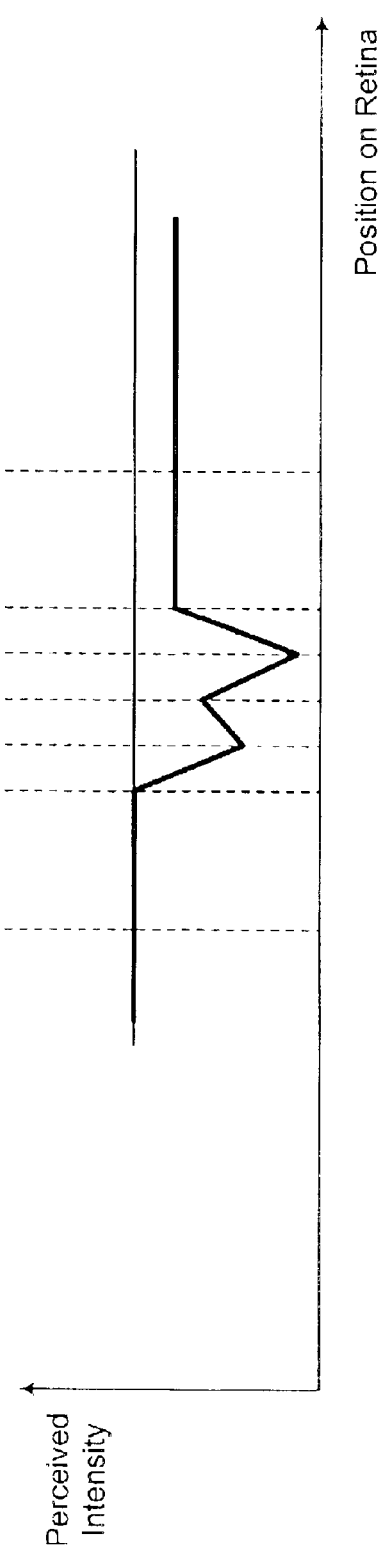

The present invention provides a method and an apparatus for selectively updating memory cells in a row of a memory cell array by providing multiple wordlines to each row such that the timing of update events to memory cells in the row are decorrelated. In display systems employing memory cells for controlling the pixels of the display system and pulse-width-modulation technique for generating grayscales or color, the decorrelation of the memory cells reduces correlation of neighboring pixels. The dynamic-false-contouring artifacts are thereby reduced. In another application, the multiple wordlines of each row of the memory cell array enable read back of voltages stored in memory cells, enhancing the device's testability.

To selectively update memory cells of a row of a memory cell array, the memory cells of the row are divided into subgroups according to a predefined criterion. For example, neighboring memory cells in a row are grouped into separate subgroups. For another example, the positions of the memory cells in a row in different subgroups are interleaved. A plurality of wordlines is provided for each row of the memory cell array. The memory cells are connected to the plurality of wordlines such that memory cells in the same subgroup are connected to the same wordline, and memory cells in different subgroups are connected to separate wordlines. With this configuration, memory cells in different subgroups are activated or updated independently by separate wordlines. Memory cells in different subgroups of the row can be activated asynchronously or synchronously as desired by scheduling the activation events of the wordlines. Moreover, memory cells in different rows of the memory cell array can be selectively updated asynchronously or synchronously as desired. For example, one can simultaneously update memory cells in a subgroup (e.g. even numbered memory cells) of a row and memory cells in another subgroup (e.g. odd numbered memory cells) of a different row. Of course, memory cells in different subgroups of different rows can be activated at different times.

In an application of display systems that employ memory cell arrays for controlling the pixels of the system and pulse-width-modulation technique, perceived artifacts, such as dynamic-false-contouring (DFC) artifacts can be reduced, if not removed. To attain this purpose, the original DFC artifacts, which are formed at the boundaries of neighboring pixels having different gray scales, are intentionally reproduced and distributed over the entire pixel row. As a result, the reproduced and the original DFC artifacts are redistributed at a higher spatial frequency. That is, the original DFC artifacts will no longer be recognized by viewer as the "real" contour of the object.

To redistribute the DFC artifacts, illumination-intensity modulations are performed differently at the neighboring pixels of the row. As a result, the averaged illumination intensity at each boundary of neighboring pixels varies and forms DFC artifacts. In order to modulate the neighboring pixels in different ways, the memory cells controlling the neighboring pixels are expected to be activated or updated independently. The present invention provides multiple wordlines for the memory cells in each row of the memory cell array. This enables the memory cells controlling the selected neighboring pixels to be connected to and activated by separate wordlines.

Embodiments of the present invention can be implemented in a variety of ways and systems, such as optical switches and display systems. In the following, embodiments of the present invention will be discussed in a display system that employs micromirror arrays and PWM technique, wherein individual micromirrors of the micromirror array are controlled by memory cells. For clarity and demonstration purposes without losing generality, the embodiments will be illustrated using a simplified 4-bit grayscale on a memory cell array. It will be understood that the embodiments of the present invention are applicable to any grayscale or color pulse-width-modulation waveform, such as those described in U.S. Pat. No. 6,388,661, and U.S. patent application Ser. No. 10/340,162, filed on Jan. 10, 2003, both to Richards, the subject matter of each being incorporated herein by reference. Each memory cell of the array may be a 1T1C (one transistor and one capacitor) circuit. Each row of the memory cell array is provided with two wordlines. It will be apparent to one of ordinary skill in the art that the following discussion applies generally to other types of memory cells, such as DRAM, SRAM or latch. The wordlines for each row of the memory array can be of any suitable number equal to or larger than two. Other PWM waveforms (e.g. other bit-depths and/or non binary weightings) may also be applied. Furthermore, although not limited thereto, the present invention is particularly useful for operating micromirrors such as those described in U.S. Pat. No. 5,835,256, the contents of which are hereby incorporated by reference.

Figure 3:
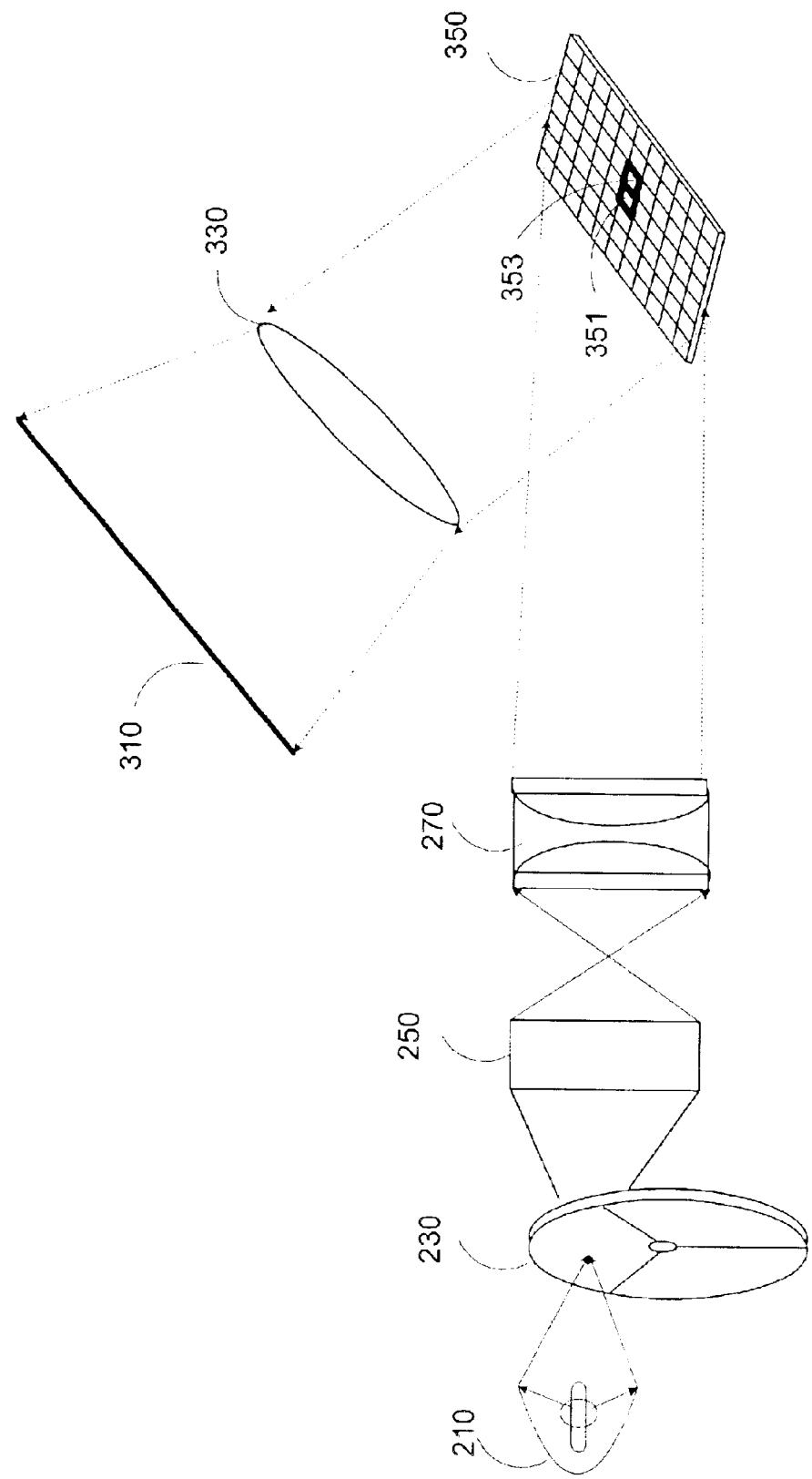
FIG. 3 shows a simplified display system that employs a MEMS-based spatial light modulator.

Referring to FIG. 3, a simplified display system, in which embodiments of the presented invention may be implemented, is illustrated therein. The display system employs a spatial light modulator (hereafter, SLM) and pulse-width-modulation technique. A light source 210 and associated optical devices, such as light pipe 250, optical lens 270, focus a light beam onto SLM 350. The pixels of SLM are individually controllable and an image is formed by modulating the incident light beam as desired at each pixel. Modulated light from each SLM pixel passes through projection lens 330 and is projected onto display target 310, which shows an image composed of bright and dark pixels corresponding to the image data loaded into the SLM. For displaying color images, color wheel 230 is provided as shown in the figure.

In order to produce the perception of a gray-scale or full color image in such a display system, it is necessary to rapidly modulate the pixels between "ON" and "OFF" states such that the average over a time period (e.g. the time period corresponds to the critical flicker frequency) of their modulated brightness corresponds to the desired "analog" brightness for each pixel. This technique is generally referred to as pulse-width-modulation (PWM). Above a certain modulation frequency, the viewer eyes and brain integrate a pixel's rapid varying brightness and perceived brightness determined by the pixel's average illumination over a period of time. The modulation of illumination of pixels is controlled by a memory cell array associated with the pixels of the display system.

Figure 4:
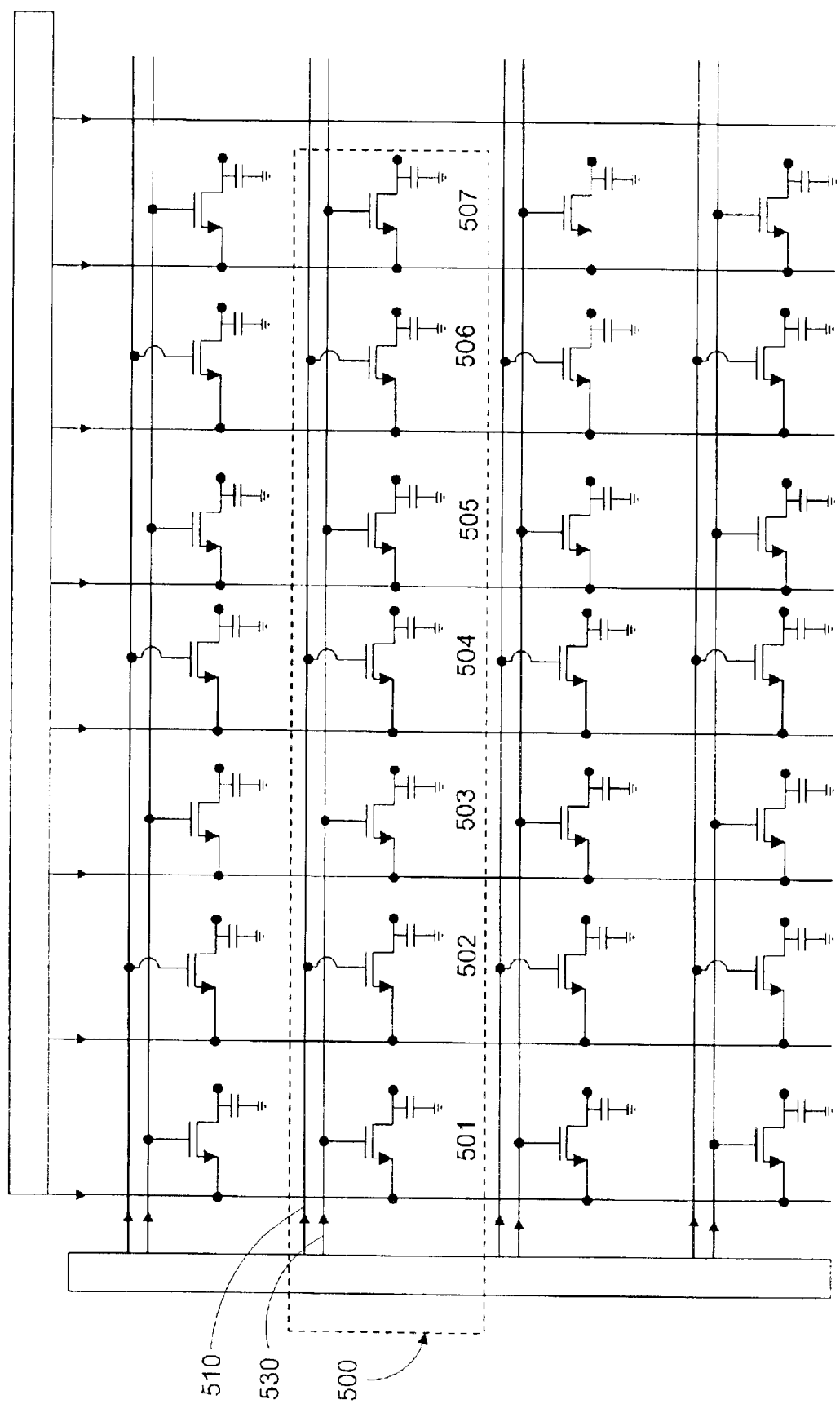
Figure 4A:
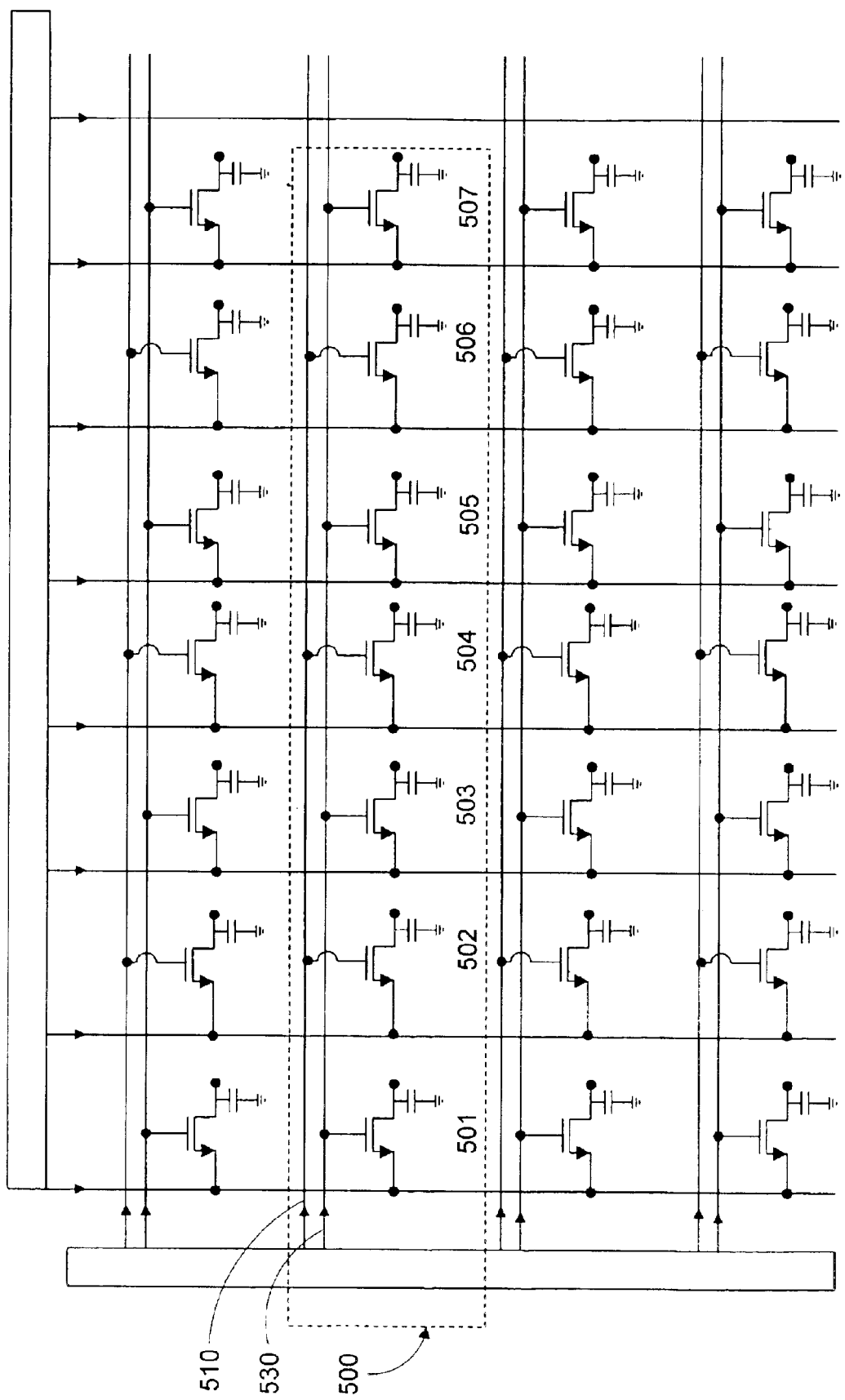
FIG. 4a illustrates a micromirror array having duel wordlines for each row of the memory cells according to an embodiment of the invention.

Referring to FIG. 4a, a memory cell array according to an embodiment of the invention is illustrated therein. The memory cell array has two wordlines for each row of the array, and memory cells of a row are connected to separate wordlines. For example, memory cell row 500 has two separate wordlines 510 and 530. Neighboring memory cells of each row are connected to separate wordlines. Specifically, odd numbered memory cells are in one subgroup, and even numbered memory cells are in another subgroup. Memory cells in different subgroups are connected to separate wordlines. For example, memory cells 501 and 502 are respectively connected to wordlines 530 and 510. Memory cells in the same subgroup are connected to the same wordline. For example, memory cells 501 and 503 (or memory cells 502 and 504) are connected to wordline 530 (or 510). With this configuration, neighboring memory cells can be activated separately. The time-correlation between neighboring pixels in current memory cell arrays can thus be removed. In an aspect of the invention, neighboring memory cells can also be activated asynchronously or synchronously as desired by properly scheduling the activation events of the wordlines. For example, memory cell 501 can be activated earlier via wordline 530 than memory cell 502 via wordline 510. Of course, the two wordlines can be synchronized, and all memory cells in the row (e.g. row 500) can be activated at the same time by synchronizing the wordlines.

Figure 5A:
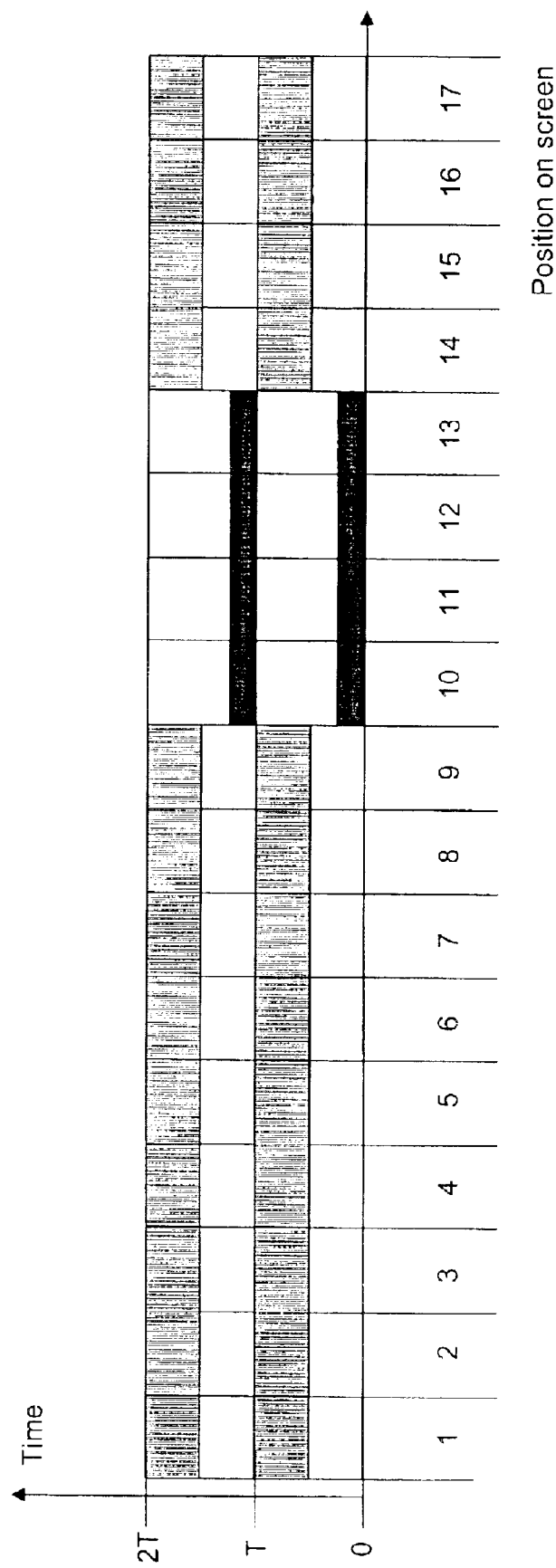
FIG. 5a illustrates a row of pixels displaying gray-scaled images of a moving object in the screen coordinate.

Under the control of the memory cell array in FIG. 4a, DFC artifacts can be reduced in the display system in FIG. 3. For simplicity and illustration purposes, gray-scaled images of an object that moves from left to right are to be displayed by a row of pixels of the spatial light modulator 350 in FIG. 3. Referring to FIG. 5a, the pixel row has 17 pixels numbered from 1 to 17. Each of the pixels is associated with a memory cell of row 500 in FIG. 4a for electrostatically controlling the pixel.

Figure 4B:
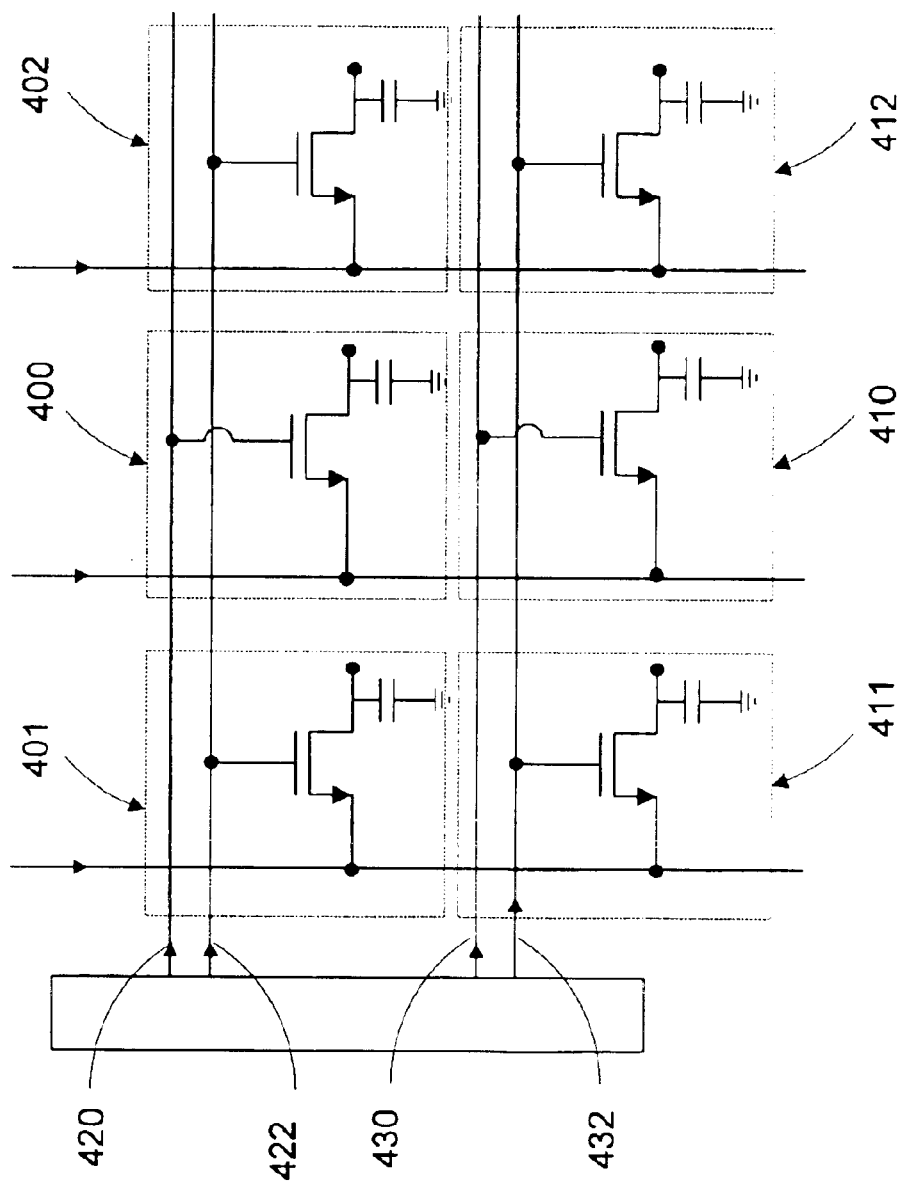

FIG. 4b is a sub-array of the memory cell array in FIG. 4a. As can be seen in this 2×3 array, memory cell 400 is connected to wordline 420, whereas memory cells 401, 402 are connected to word line 422. Likewise, memory cell 410 is connected to wordline 430, whereas memory cells 411 and 412 are connected to wordline 432. Four wordlines are used to connect to the six (6) memory cells. Wordlines 422 and 432 connect to every other memory cell in the row (as do all the wordlines as can be seen more clearly in FIG. 4a).

Figure 6A:
FIG. 6a demonstrates a 4-bits binary-weighted waveform format.
Figure 7:
FIG. 7 shows another exemplary binary-weighted waveform format according to another embodiment of the invention.
Figure 9A:
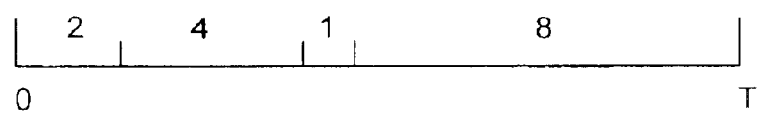
FIG. 9a present yet another exemplary waveform format according to yet another embodiment of the invention.
Figure 9B:
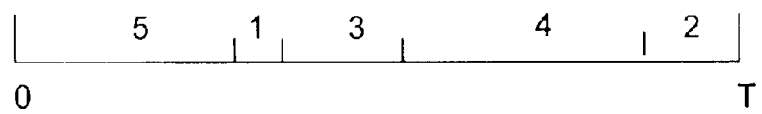
FIG. 9b presents a further exemplary waveform format according to a further embodiment of the invention.

In order to simulate grayscales of the moving object, PWM waveforms are generated according to the predefined PWM waveform formats and the desired grayscales. In the embodiment of the invention, at least two binary-weighted PWM waveform formats are defined. A first PWM waveform format is a binary-weighted waveform format starting from the least significant bit (LSB) and ending at the most significant bit (MSB), as shown in FIG. 6a. A second PWM waveform format is a binary-weighted waveform format starting from the MSB and ending at the LSB, as shown in FIG. 7. Though preferred, other suitable waveform formats could also be applied. In particular, the waveform format can be a binary-weighted format with the binary weights randomly arranged, as shown in FIG. 9a. Alternatively, the waveform format can be non-binary weighted format, as shown in FIG. 9b.

Figure 8A:
FIG. 8a and FIG. 8b present two exemplary waveforms generated according to the waveform format in FIG. 7.
Figure 8B:
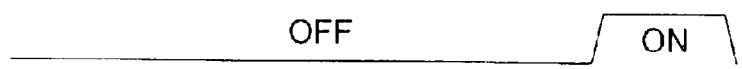

Given the defined waveform formats, PWM waveforms are generated according to the desired grayscales. For example, PWM waveforms shown in FIGS. 6b and 6c are generated based on the defined format of FIG. 6a. And PWM waveforms shown in FIGS. 8a and 8b are generated based on the defined format of FIG. 7. Referring to FIG. 6b, the waveform is in the "OFF" state during the first 7 (7=1+2+4) segments of the frame duration T and turned "ON" for the rest 8 segments. Referring to FIG. 6c, the waveform presented therein is turned "ON" for the first 3 (3=1+2) segments of the frame duration T and turned "OFF" for the rest 12 (12=4+8) segments. By feeding the waveforms shown in FIGS. 6b and 6c into the pixels in FIG. 5a, illumination intensities of the pixels are modulated over the frame duration T. Specifically, within the first duration T, pixels 1 through 9, and 14 through 17 are turned "OFF" (dark) during the first 7 segments of the frame duration T. These pixels are then turned "ON" (bright) for the rest 8 segments. Pixels 10 through 13 are first turned "ON" for the first 3 waveform segments and turned "OFF" for the rest 12 segments. The modulation is repeated for the following frame duration (e.g. from T to 2T). In this way, illumination intensities are distributed over the 17 pixels during the frame duration T. This illumination pattern, however, is distorted in the retina coordinate of viewer's eyes that moves with the moving object, as shown in FIG. 5b.

Figure 5B:
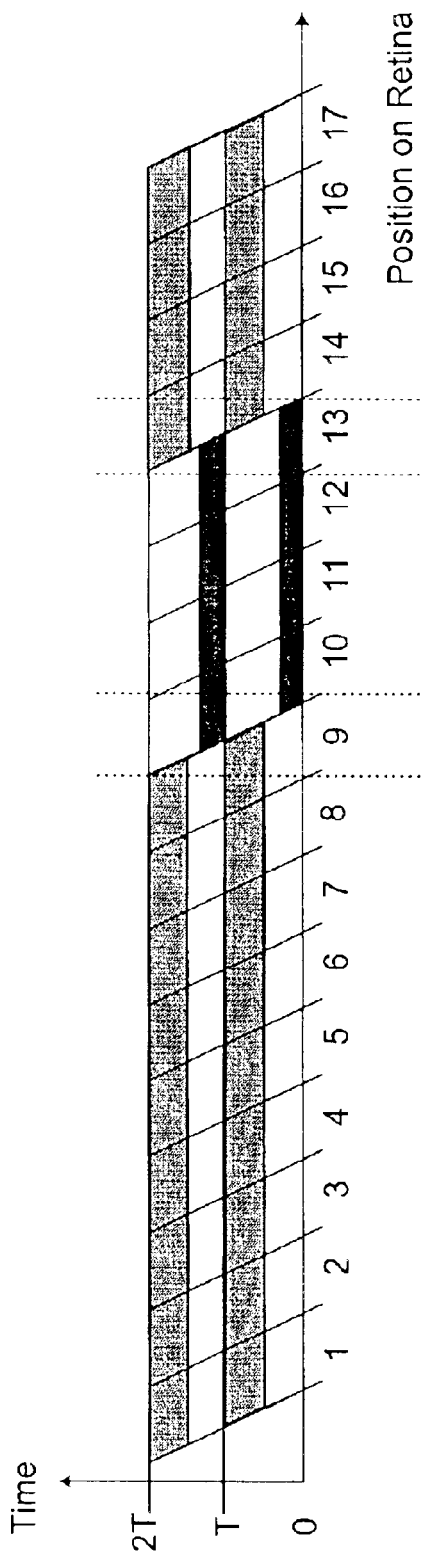
FIG. 5b illustrates a row of prior art pixels viewed by viewer eyes, the pixels showing a gray-scaled image of a moving object, and the viewer eyes following the motion of the moving object.
Figure 5C:
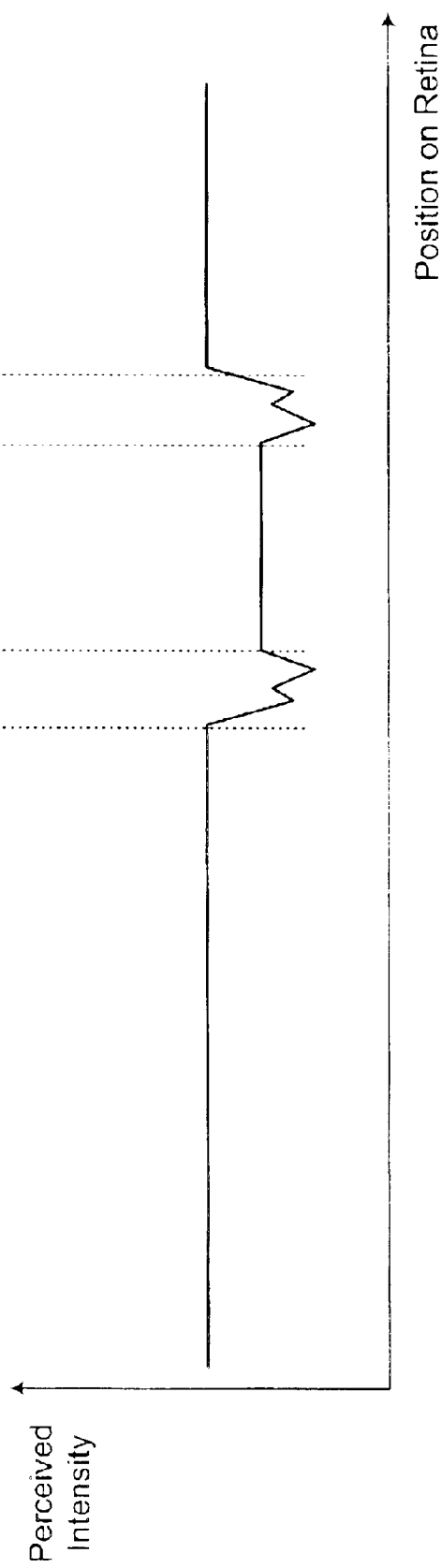
FIG. 5c illustrate the perceived illumination intensity of the pixels in FIG. 15b.
Figure 6B:
Figure 6C:
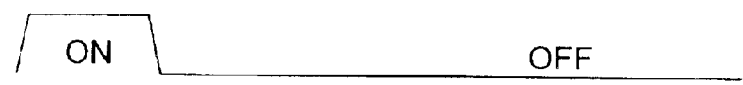

Referring to FIG. 5b, DFC artifacts are generated at the boundaries of pixels having different illumination intensities. Specifically, pixels 9 and 10 have different distribution of illumination intensities. The averaged illumination intensity, thus the perceived illumination intensity, varies in the boundary of the two pixels, as show in FIG. 5c. This variation is perceived by the viewer's eyes as the "real" contour of the object. For the same reason, another DFC artifact is generated at the boundary of pixels 13 and 14.

In order to reduce these perceived DFC artifacts, these original DFC artifacts are intentionally reproduced between selected pixels and distributed over the pixel row. To attain this purpose, a second set of PWM waveforms, which is different from the first set of waveforms corresponding for driving the pixels to display desired grayscales, is generated. In the embodiment of the invention, a second set of PWM is generated based on a second PWM waveform format, as shown in FIG. 7. The second waveform format is a binary-weighted waveform format starting from the MSB and ending at the LSB. FIGS. 8a and 8b show two exemplary PWM waveforms generated based on such waveform format. Referring to FIG. 8a, the waveform is in "ON" state for the first 8 segments of the frame duration T and turned "OFF" for the rest 7 segments. Referring to FIG. 8b, the waveform is "OFF" for the first 12 segments of the frame duration T and turned "ON" for the rest 3 segments. The generated waveforms in FIGS. 6b, 6c, 8a and 8b are applied concurrently for driving the pixels of the row for reproducing the DFC artifacts, as shown in FIG. 10a.

Figure 10A:
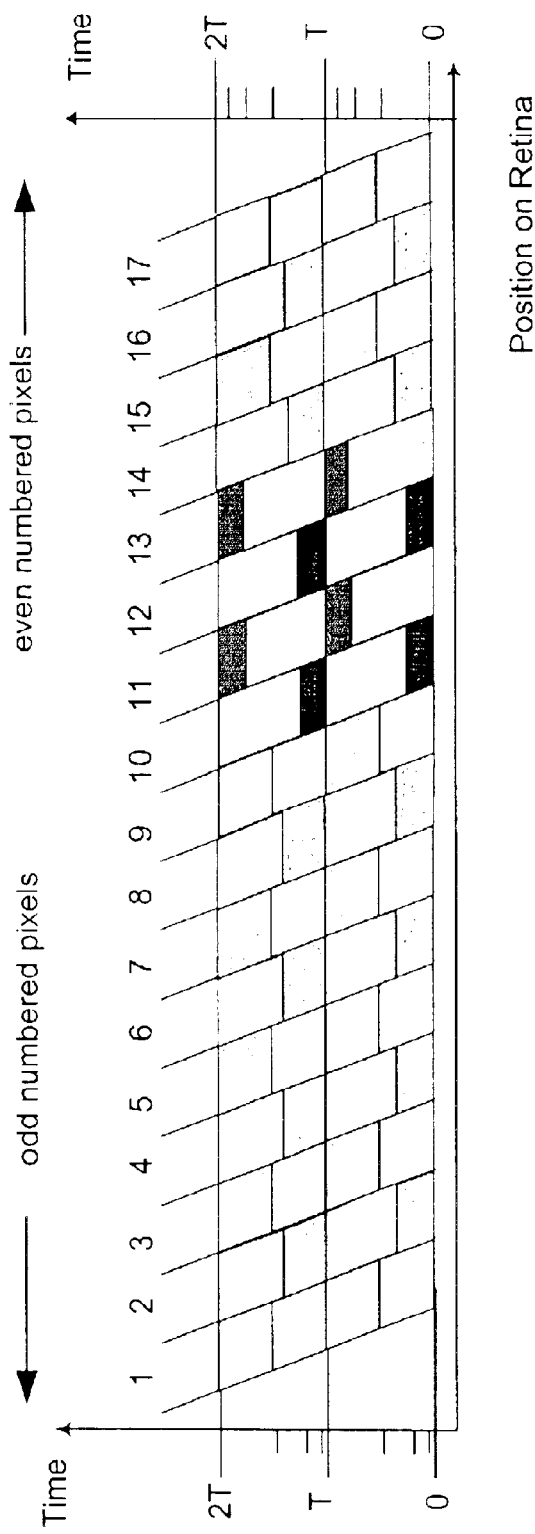
Figure 10B:
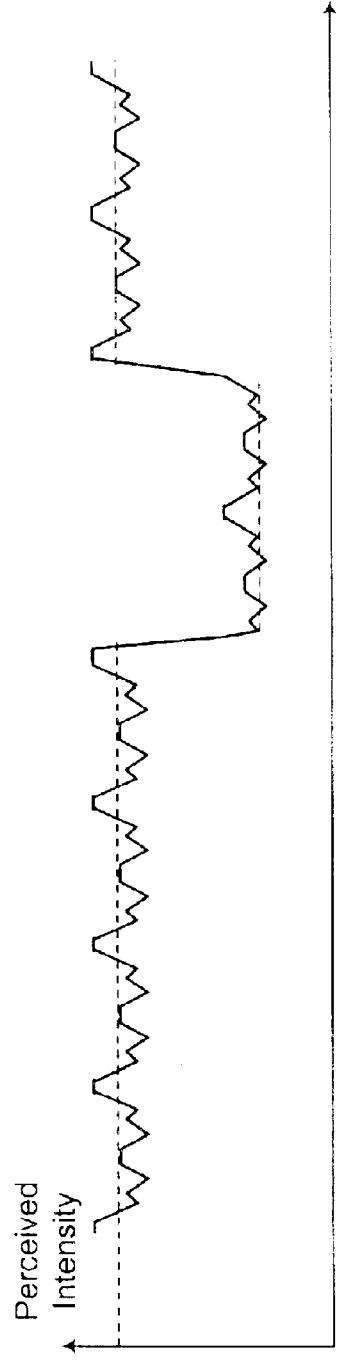

Referring to FIG. 10a, odd numbered pixels 1 to 9, 15 and 17 are driven by the waveform in FIG. 6b. Odd numbered pixels 11 and 13 are driven by the waveform in FIG. 6c. Because these waveforms are generated according to the desired grayscales of the images, the perceived grayscales of these odd numbered pixels by viewer's eyes correspond to the desired grayscales of the images. To reproduce the DFC contouring, the waveform in FIG. 8a is applied to the even numbered pixels 2 to 8, 14 and 16. And the waveform in FIG. 8b is applied to the even numbered pixels 10 and 12. As a consequence, neighboring memory cells are modulated with different waveforms. The averaged illumination intensity varies in each boundary of neighboring odd and even numbered pixels, as shown in FIG. 10b.

Referring to 10b, DFC artifacts are reproduced in the pixel row. As can been seen, the illumination intensity varies in a small range relative to background illumination intensities, represented by dash lines in the figure. The background illumination intensities correspond to the averaged illumination intensities, shown in FIG. 5c, and desired grayscales of the image. Because of this, the reproduced DFC artifacts are perceived as background "noise" by the viewer.

As described above, the pixels are selectively modulated with different waveforms. This modulation is controlled by the memory cells of row 500 in FIG. 4. Because the neighboring memory cells are connected to and capable of being activated by separate wordlines, the associated neighboring pixels can be driven independently by separate waveforms. For example, odd numbered memory cells are activated by wordline 530. The odd memory cells 1 to 9, 15 and 17 can be written according to the PWM waveform in FIG. 6b, and the odd numbered memory cells 11 and 13 can be written according to the PWM waveform in FIG. 6c. Specifically, the odd numbered memory cells 1 to 9, 15 and 17 are set to a voltage state corresponding to the "OFF" state of the pixels for the first 7 segments of the frame duration T, and set to another voltage state corresponding to the "ON" state for the rest 8 segments. The memory cells 11 and 13 are set to the same voltage state corresponding to the "OFF" state for the first 3 segments of the frame duration and set to the same another voltage state corresponding to the "ON" state of the pixels. In this way, the odd numbered pixels associated with the odd numbered memory cells are tuned "ON" and "OFF" according to the desired waveforms for displaying the desired grayscales of the images.

Independent from the activation and update of the odd numbered memory cells, the even numbered memory cells are activated and updated by wordline 510 in FIG. 4. The even numbered memory cells 2 to 8, 14 and 16 are then written according to the PWM waveform in FIG. 8a, and the even numbered memory cells 10 and 12 are written according to the PWM waveform in FIG. 8b. Specifically, the even numbered memory cells 2 to 8, 14 and 16 are set to the voltage state corresponding to the "ON" state for the first 8 waveform segments of the frame duration T and set to the voltage state corresponding to the "OFF" state for the rest 7 segments. The even numbered memory cells 10 and 12 are set to the voltage state corresponding to the "OFF" state for the first 12 segments of the frame duration T and to the voltage state corresponding to the "ON" state for the rest 3 segments. It can be seen that the even and odd numbered memory cells are activated and written independently, the associated even and odd numbered pixels are thus updated independently and driven by separate waveforms. Thereby, differences of illumination intensities, and thus DFC artifacts, are created at the boundaries of even and odd numbered pixels.

Figure 11:
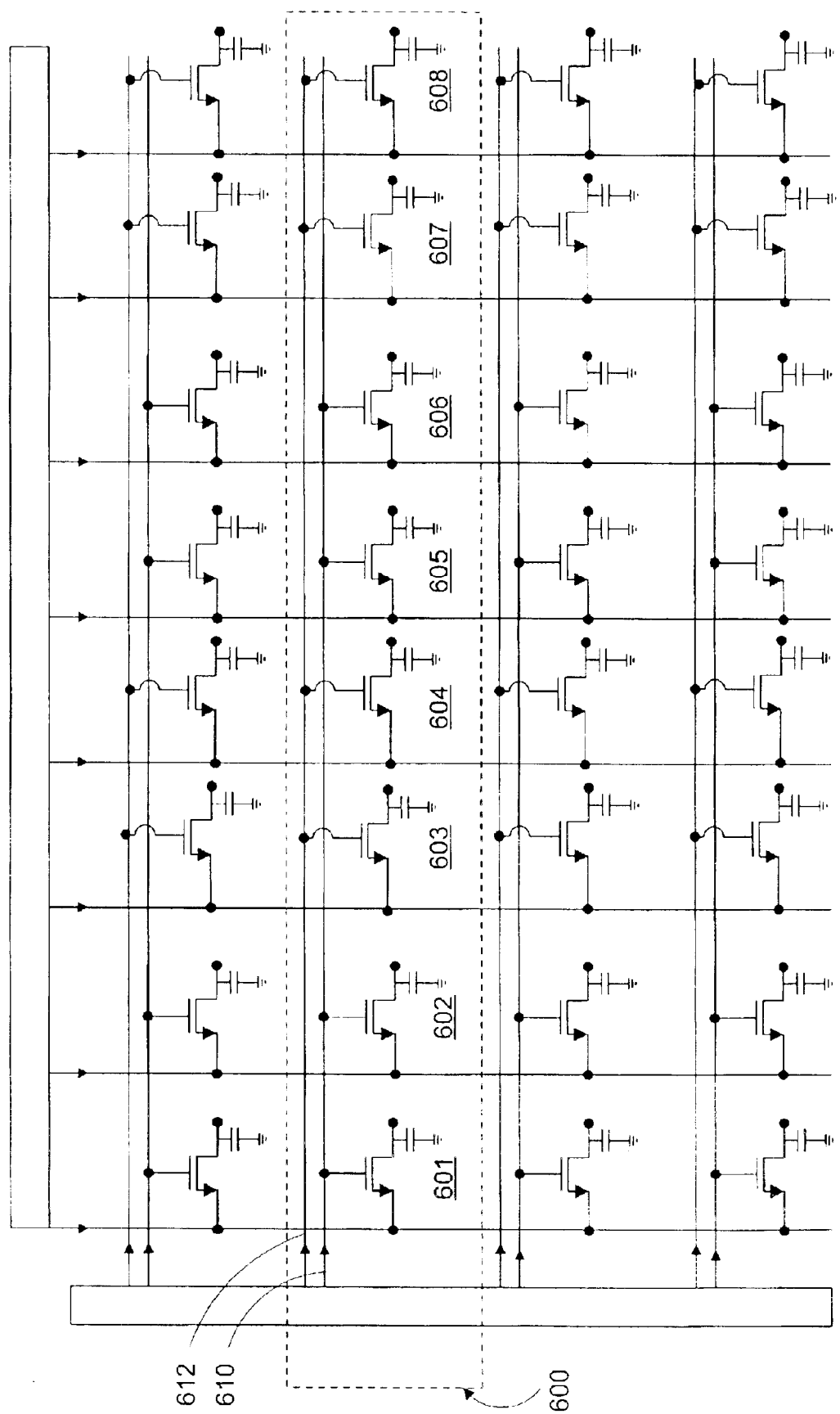
FIG. 11 illustrates a memory cell array having dual wordlines for each row of the memory cell array according to another embodiment of the invention.

In the above described embodiments, the memory cells of each row of the memory cell array are grouped such that neighboring memory cells are in different subgroups and connected to separate wordlines. According to another embodiment of the invention, the memory cells of each of the memory cell array are grouped such that the positions of the memory cells in different subgroups are interleaved in the row, as shown in FIG. 11. Referring to FIG. 11, memory cells 601, 602, 605 and 606 of row 600 are in the same subgroup and are connected to the same wordline (e.g. wordline 610). Memory cells 603, 604, 607 and 608 of row 600 are grouped in another subgroup and are connected to wordline 612 that is separate from wordline 610.

Figure 12:
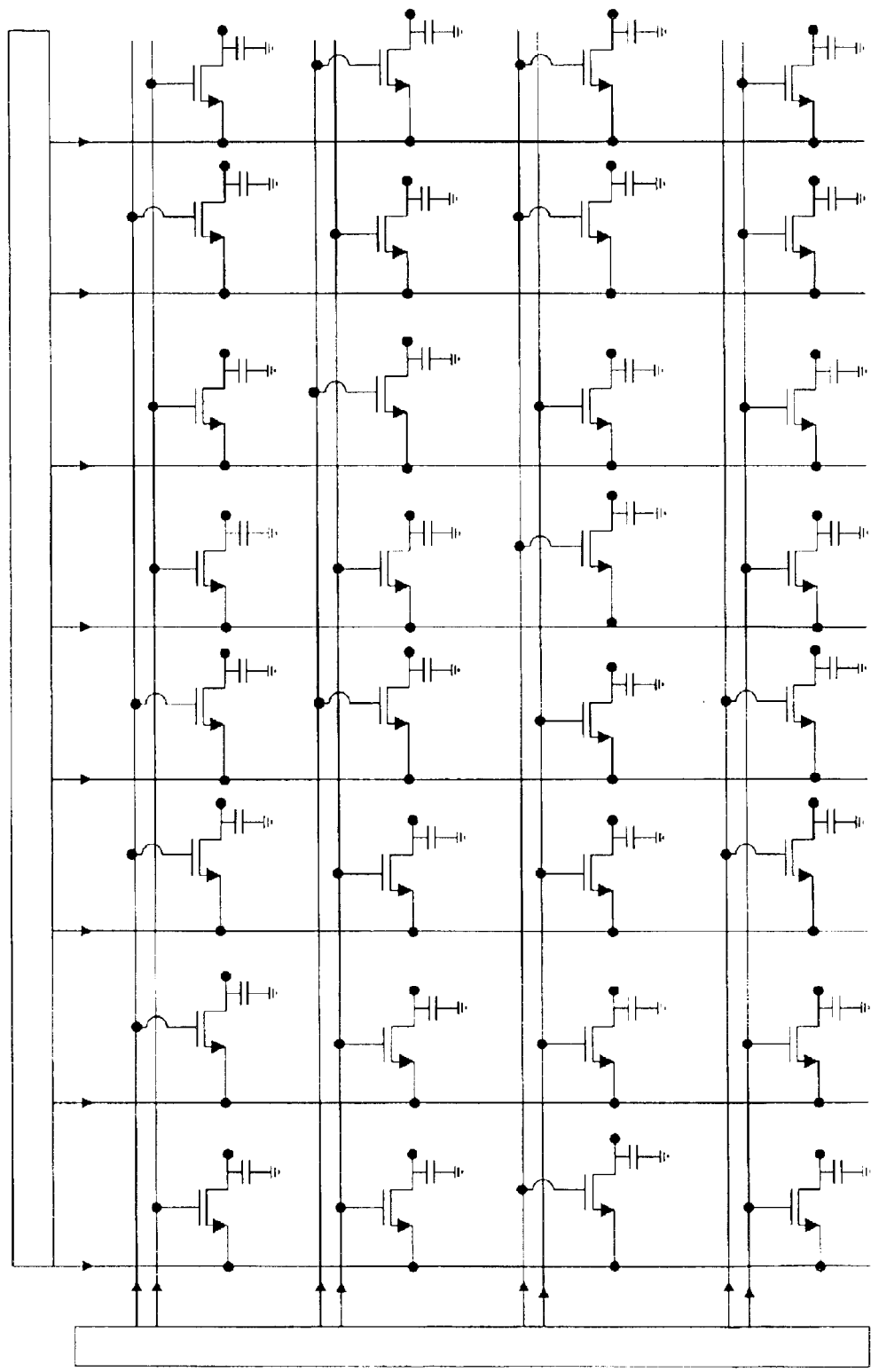
FIG. 12 illustrates a memory cell array having dual wordlines for each row of the memory cell array according to yet another embodiment of the invention.

In yet another embodiment of the invention, memory cells of each row of the memory cell array are grouped randomly and at least two memory cells in the same row are grouped into different subgroups, as shown in FIG. 12.

Figure 13:
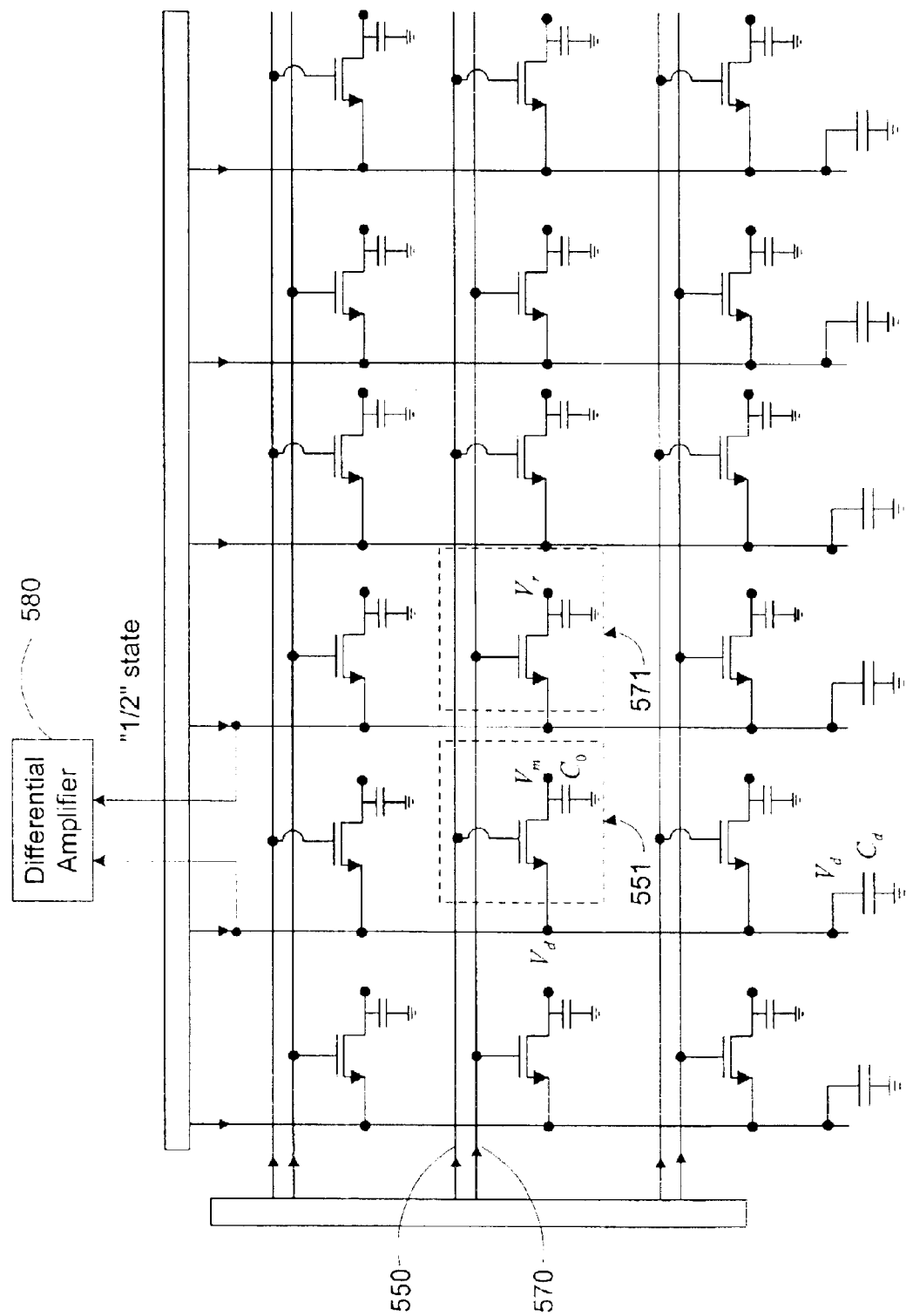
FIG. 13 is a diagram demonstrating a method for measuring the state of a memory cell in a memory cell array according to a further embodiment of the invention.

As another application, the provision of multiple wordlines for each row of a memory cell array enables readout of voltages maintained by memory cells of spatial light modulators, as shown in FIG. 13. Referring to FIG. 13, the voltage $V_m$ maintained by memory cell 551 is to be measured. In general, $V_m$ is difficult to be measured precisely and directly (e.g. directly measure the voltage drop across the capacitor $C_0$). This arises from facts that $C_0$ is much smaller than the distributed capacitor $C_d$, and $V_m$ (maintained by $C_0$) is superpositioned with $V_d$ (maintained by $C_d$) that is much larger than $V_m$. $C_d$ is a distributed capacitor that is formed for example, by parasitic capacitance of the bitlines. An efficient way to precisely measure $V_m$ is to extract $V_m$ from the large voltage background $V_d$ using a differential amplifier (e.g. 580 in FIG. 13). The differential amplifier concurrently measures a signal from the memory cells to be measured and a reference voltage signal. The large voltage background (e.g. $V_d$) that is common to the two signals will be removed from the two measured signals, and the small difference of the two voltage signals is extracted and amplified for precise measurement. Given the reference signal, the small voltage $V_m$ can thus be determined.

According to an embodiment of the invention, memory cell 551 that is to be measured and memory cell 571 that is adjacent to memory cell 551 are two memory cells of a spatial light modulator (not shown) and are respectively connected to wordlines 550 and 570. In a measurement, memory cell 571 is activated by wordline 570 and set to a reference voltage $V_r$ corresponding to a predefined reference state. As an example, assuming that the "ON" state of the memory cell corresponds to +15V and the "OFF" state corresponds to 0V, then reference voltage $V_r$ can be +7.5V (7.5=15/2), represented by "½" state. Then, memory cell 551 is independently activated by wordline 550. Differential amplifier 580 measures voltage signals from memory cells 551 and 571, and extracts the difference of $V_m$ and $V_r$. Because $V_r$ is set to a known reference voltage (+7.5V), $V_m$ can thus be determined. Based on the comparison of $V_m$ and $V_r$, the state of memory cell 551 can also be determined. For example, if the absolute value of $V_m$ is larger than the absolute value of $V_r$, memory cell 551 is said to be in the "ON" state. Otherwise, memory cell 551 is said to be in the "OFF" state.

It will be appreciated by those of skill in the art that a new and useful method and apparatus for selectively updating memory cells of a memory cell array have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Although the invention is described with reference to DRAM memory cells in display systems employing SLM, those skilled in the art will recognize that such may be equivalently replaced by any suitable memory cells, such as charge-pump pixel cell (described patent application, Ser. No. 10,340,162, filed on Jan. 10, 2003 to Richards), SRAM or latch and optical switches using SLM. Though 4-bits binary-weighted PWM waveform formats are used in describing the embodiments of the invention, this should not be interpreted as limitations of the invention. For example, 128 bits or 256 bits weightings could be applied. Instead, any suitable PWM waveforms are applicable for driving the pixels of the display system. Therefore, the invention as described herein contemplates all such embodiments as may come within the scope of the following claims and equivalents thereof.

I claim:

1. A projector, comprising:

a light source;

a spatial light modulator, comprising:
      an array of micromirrors; and
      a plurality of wordlines, wherein each wordline is connected to every other micromirror in a row of the micromirror array;

a set of optical elements; and a display target.

2. The projector of claim 1, wherein adjacent micromirrors in a row of the array are connected to separate wordlines of the plurality of wordlines for the row.

3. The projector of claim 2, wherein at least two wordlines are connected to the micromirrors of a row of the micromirror array, wherein each wordline is connected to every other micromirror of the row of the micromirror array; and the wordlines are connected to different micromirrors.

4. The projector of claim 1, wherein four wordlines are connected to micromirrors of a 2×3 micromirror sub-array of the micromirror away.

5. The projector of claim 1, wherein each micromirror of the micromirror array is associated with a memory cell connected to an electrode, and wherein each micromirror comprises a deflectable reflective mirror plate that is coupled to the electrode end memory cell.

6. The projector of claim 5, wherein the memory cell is a charge-pump memory cell.

7. The projector of claim 5, wherein the memory cell is a DRAM.

8. The projector of claim 5, wherein the micromirror and the memory cell are formed on a semiconductor substrate.

9. The projector of claim 5, wherein the micromirror and the memory cell are formed on separate substrates.

10. The projector of claim 9, wherein the micromirror is formed on a tight transmissive substrate.

11. The projector of claim 9, wherein the memory cell comprises a transistor and a capacitor farmed on a semiconductor substrate.

12. The projector of claim 1, further comprising: a color wheel.

13. The projector of claim 1, further comprising: a light pipe.

\* \* \* \* \*